(12) United States Patent
Wang et al.

(10) Patent No.: US 7,945,716 B2
(45) Date of Patent: May 17, 2011

(54) SERIAL BUFFER SUPPORTING VIRTUAL QUEUE TO PHYSICAL MEMORY MAPPING

(75) Inventors: Chi-Lie Wang, Milpitas, CA (US); Calvin Nguyen, San Jose, CA (US); Mario Au, Fremont, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 461 days.

(21) Appl. No.: 11/863,176

(22) Filed: Sep. 27, 2007

(65) Prior Publication Data

US 2009/0089532 A1    Apr. 2, 2009

(51) Int. Cl.
*G06F 13/10* (2006.01)
(52) U.S. Cl. .................. 710/56; 710/29; 710/36
(58) Field of Classification Search .................. 710/56
See application file for complete search history.

(56) References Cited

U.S. PATENT DOCUMENTS

| | | | |
|---|---|---|---|
| 4,298,954 A | 11/1981 | Bigelow et al. | |
| 4,335,277 A | 6/1982 | Puri | |
| 5,224,213 A | 6/1993 | Dieffenderfer et al. | |
| 5,257,384 A | 10/1993 | Farrand et al. | |
| 5,717,883 A | 2/1998 | Sager | |
| 5,765,041 A * | 6/1998 | Cherichetti et al. | 710/52 |
| 5,790,895 A * | 8/1998 | Krontz et al. | 710/64 |
| 5,996,032 A * | 11/1999 | Baker | 710/62 |
| 6,002,760 A * | 12/1999 | Gisby | 379/266.01 |
| 6,047,339 A | 4/2000 | Su et al. | |
| 6,161,153 A * | 12/2000 | Porterfield et al. | 710/52 |
| 6,269,413 B1 * | 7/2001 | Sherlock | 710/52 |
| 6,271,866 B1 * | 8/2001 | Hancock et al. | 345/544 |
| 6,393,493 B1 * | 5/2002 | Madden et al. | 719/321 |
| 6,594,714 B1 * | 7/2003 | Swanson et al. | 710/51 |
| 6,636,908 B1 * | 10/2003 | Winokur et al. | 710/29 |
| 6,735,636 B1 * | 5/2004 | Mokryn et al. | 710/5 |
| 6,757,756 B1 * | 6/2004 | Lanteigne et al. | 710/52 |
| 6,816,929 B2 | 11/2004 | Ueda | |
| 6,925,506 B1 * | 8/2005 | Raza et al. | 710/52 |
| 7,023,857 B1 * | 4/2006 | Chiussi et al. | 370/395.4 |
| 7,454,536 B1 * | 11/2008 | Walton et al. | 710/52 |
| 7,545,731 B2 * | 6/2009 | Agin et al. | 370/204 |
| 7,698,474 B2 * | 4/2010 | Lin et al. | 710/22 |
| 7,814,242 B1 * | 10/2010 | Wentzlaff | 710/52 |
| 2004/0225779 A1 * | 11/2004 | Zhao et al. | 710/200 |
| 2005/0283598 A1 | 12/2005 | Gaskins et al. | |
| 2008/0205422 A1 | 8/2008 | Wang et al. | |

* cited by examiner

*Primary Examiner* — Cheng-Yuan Tseng
(74) *Attorney, Agent, or Firm* — Bever Hoffman & Harms

(57) ABSTRACT

A serial buffer having a plurality of virtual queues, which can be allocated to include various combinations of on-chip dual-port memory blocks, on-chip internal memory blocks and/or off-chip external memory blocks. The virtual queues are allocated and accessed in response to configuration bits and size bits stored on the serial buffer. Relatively large external memory blocks can be allocated to virtual queues used for data intensive operations, while relatively small and fast dual-port memory blocks can advantageously be allocated to virtual queues used for passing command and status information. The serial buffer provides an efficient and flexible manner for utilizing available memory, which not only minimizes the access latency but also provides a large amount of buffer space to meet different application needs.

16 Claims, 9 Drawing Sheets

| | dp(n)_total | dp(n)_size | im(n)_total | em(n)_total | imem(n)_size | VQ(n)_size |
|---|---|---|---|---|---|---|
| n = 0 | 2 | 128 | 0 | 0 | 0 | 128 |
| n = 1 | 0 | 0 | 3 | 0 | 96k | 96k |
| n = 2 | 0 | 0 | 2 | 2 | 576k | 576k |
| n = 3 | 0 | 0 | 0 | 1 | 256k | 256k |
| n = 4 | 1 | 64 | 0 | 0 | 0 | 64 |
| n = 5 | 0 | 0 | 1 | 0 | 32k | 32k |
| n = 6 | 1 | 64 | 0 | 0 | 0 | 64 |
| n = 7 | 0 | 0 | 2 | 1 | 320k | 320k |

CFG_IM_SIZE = 0
CFG_EM_SIZE[1:0] = '01'
CFG_EM_OFF = 0

SERIAL BUFFER SUPPORTING VIRTUAL QUEUE TO PHYSICAL MEMORY MAPPING

RELATED APPLICATIONS

The present application is related to the following commonly-owned, co-filed U.S. patent applications:

U.S. patent application Ser. No. 11/863,184 "MULTI-FUNCTION QUEUE TO SUPPORT DATA OFFLOAD, PROTOCOL TRANSLATION AND PASS-THROUGH FIFO", by Chi-Lie Wang, Jason Z. Mo and Mario Au.

U.S. patent application Ser. No. 11/863,192 "ADAPTIVE INTERRUPT ON SERIAL RAPIDIO (SRIO) ENDPOINT", by Chi-Lie Wang, Jason Z. Mo and Bertan Tezcan.

U.S. patent application Ser. No. 11/863,199 "NON-RANDOM ACCESS RAPID I/O END-POINT IN A MULTI-PROCESSOR SYSTEM", by Chi-Lie Wang, Jason Z. Mo, Stanley Hronik and Jakob Saxtorph.

FIELD OF THE INVENTION

The present invention relates to a serial buffer designed to operate as a serial RapidIO (sRIO) end-point to provide data offload, protocol translation and pass-through FIFO functions. More specifically, the present invention relates to a serial buffer that supports virtual queue to physical memory mapping.

RELATED ART

A serial buffer may be configured to implement an sRIO protocol, which requires handing both command and status information, as well as data packet storage. A serial buffer may alternately be configured to implement a Lite-weight protocol for operation with a field programmable gate array (FPGA). Some serial buffers may include the option of having two functional ports, which may implement various protocols. Thus, serial buffers may be required to operate in a variety of configurations. It would therefore be desirable to have a serial buffer to have many different possible memory configurations available to enable optimized memory access within the serial buffer for different configurations.

SUMMARY

Accordingly, the present invention provides a serial buffer having a plurality of virtual queues, which can be allocated to include various combinations of on-chip dual-port memory blocks, on-chip internal memory blocks and/or off-chip external memory blocks. In accordance with one embodiment, each dual-port memory block, internal memory block and external memory block can be assigned to any virtual queue for ease of user configuration. Relatively large external memory blocks can advantageously be allocated to virtual queues used for data intensive operations. Relatively small dual-port memory blocks can advantageously be allocated to virtual queues used for passing command and status information with minimum latency. In one embodiment, the on-chip dual-port memory blocks and the on-chip internal memory blocks can be used without any external memory blocks to minimize product cost.

The serial buffer of the present invention provides an efficient and flexible manner for utilizing available memory, which not only minimizes the access latency but also provides a large amount of buffer space to meet different application needs.

The present invention will be more fully understood in view of the following description and drawings.

BRIEF DESCRIPTION OF THE DRAWINGS

FIG. 6 is a table that lists the virtual queue sizes of the virtual queues created in the example of FIGS. 3B and 3C.

DETAILED DESCRIPTION

Figure 1:
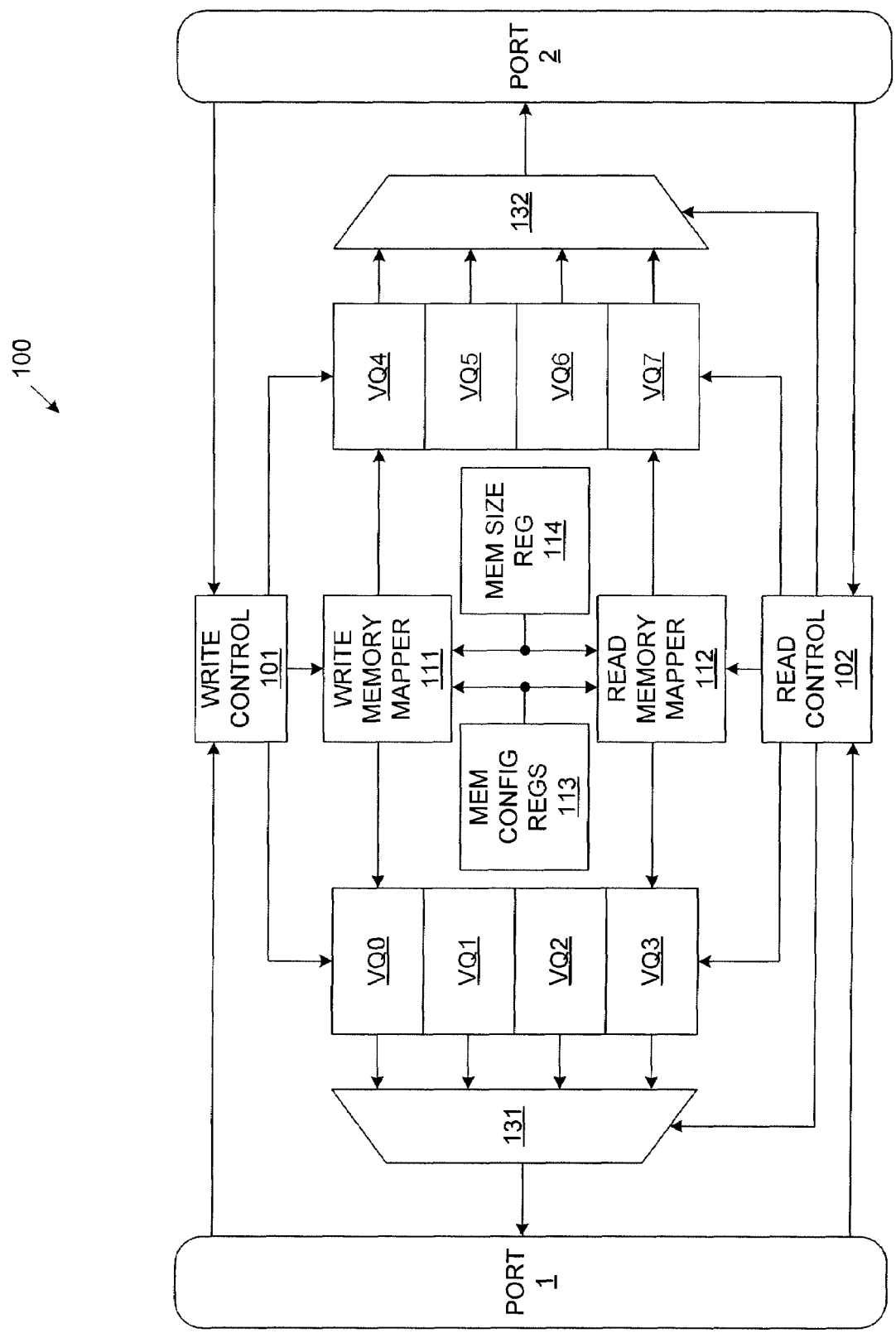
FIG. 1 is a block diagram of a serial buffer in accordance with one embodiment of the present invention.

FIG. 1 is a block diagram of a serial buffer 100 in accordance with one embodiment of the present invention. Serial buffer 100 includes ports 1-2, virtual queues VQ0-VQ7, write control circuit 101, read control circuit 102, write memory mapper 111, read memory mapper 112, memory configuration registers 113, memory size register 114, and read output multiplexers 131-132.

In the described embodiments, port 1 of serial buffer 100 may be configurable with an sRIO protocol (to function as an sRIO end-point), while port 2 of serial buffer 100 may be configurable with either an sRIO protocol or a Lite-weight protocol. Ports 1 and 2 can have other capabilities in other embodiments. In addition, other numbers of ports can be implemented on serial buffer 100 in other embodiments.

Write control circuit 101 is configured to receive data packets (which may specify write operations), from port 1 and/or port 2. In the described examples, write operations initiated from port 1 are performed to a first set of virtual queues VQ0-VQ7, and write operations initiated from port 2 are performed to a second set of virtual queues VQ0-VQ7, wherein the first and second sets of virtual queues are mutually exclusive.

In response to each write request, write control circuit 101 provides a virtual queue write enable signal that specifies the virtual queue to be written, and a write pointer value that specifies a write address within the virtual queue to be written. This virtual queue write enable signal and write pointer value are provided to write memory mapper 111.

Write memory mapper 111 is also configured to receive the contents of memory configuration registers 113 and memory size register 114. Memory configuration registers 113 store virtual queue configuration bits that define the allocation of physical memory blocks to virtual queues VQ0-VQ7. Memory size register 114 stores memory size information, which defines the capacities of physical memory blocks used to implement virtual queues VQ0-VQ7. As described in more detail below, write memory mapper 111 enables write accesses to be implemented to specific physical memory blocks in response to: the received virtual queue configuration bits received from memory configuration registers 113, the memory size information received from memory size register 114, and the virtual queue write enable signal and associated write pointer value received from write control circuit 101.

Write control circuit 101 also ensures that the write data associated with each write request specified by the received data packets is provided to the physical memory blocks associated with the virtual queue identified by with the write request. For example, if a write request specifies virtual queue VQ0, then write control circuit 101 causes the associated write data to be routed to the physical memory blocks allocated to virtual queue VQ0.

Read control circuit 102 is configured to receive read commands from port 1 and/or port 2. In response to each read command, read control circuit 102 provides a virtual queue read enable signal that identifies the virtual queue to be read. In addition, read control circuit 102 also provides a read pointer value associated with the virtual queue to be read. This virtual queue read enable signal and the associated read pointer value are provided to read memory mapper 112.

Read memory mapper 112 is also configured to receive the virtual queue configuration bits stored in memory configuration registers 113 and the memory size information stored in memory size register 114. As described in more detail below, read memory mapper 112 enables read accesses to be performed in specific physical memory blocks in response to the information received from read control circuit 102, memory configuration registers 113 and memory size register 114.

In the described embodiments, read control circuit 102 will only implement read accesses to virtual queues VQ0-VQ3 in response to read commands initiated from port 1. Similarly, read control circuit 102 will only implement read accesses to virtual queues VQ4-VQ7 in response to read commands initiated from port 2. Data read from virtual queues VQ0-VQ3 is routed through multiplexer 131 to port 1 under the control of read control circuit 102. Similarly, data read from virtual queues VQ4-VQ7 is routed through multiplexer 132 to port 2 under the control of read control circuit 102.

Read control circuit 102 also ensures that the read data associated with each read command is routed from the physical memory blocks associated with the virtual queue identified by with the read command to the read multiplexer input associated with the virtual queue identified by the read command. For example, if a read command specifies virtual queue VQ0, then read control circuit 102 causes the associated read data to be routed from the physical memory blocks allocated to virtual queue VQ0 to the input of read output multiplexer 131 associated with the virtual queue VQ0.

Figure 2:
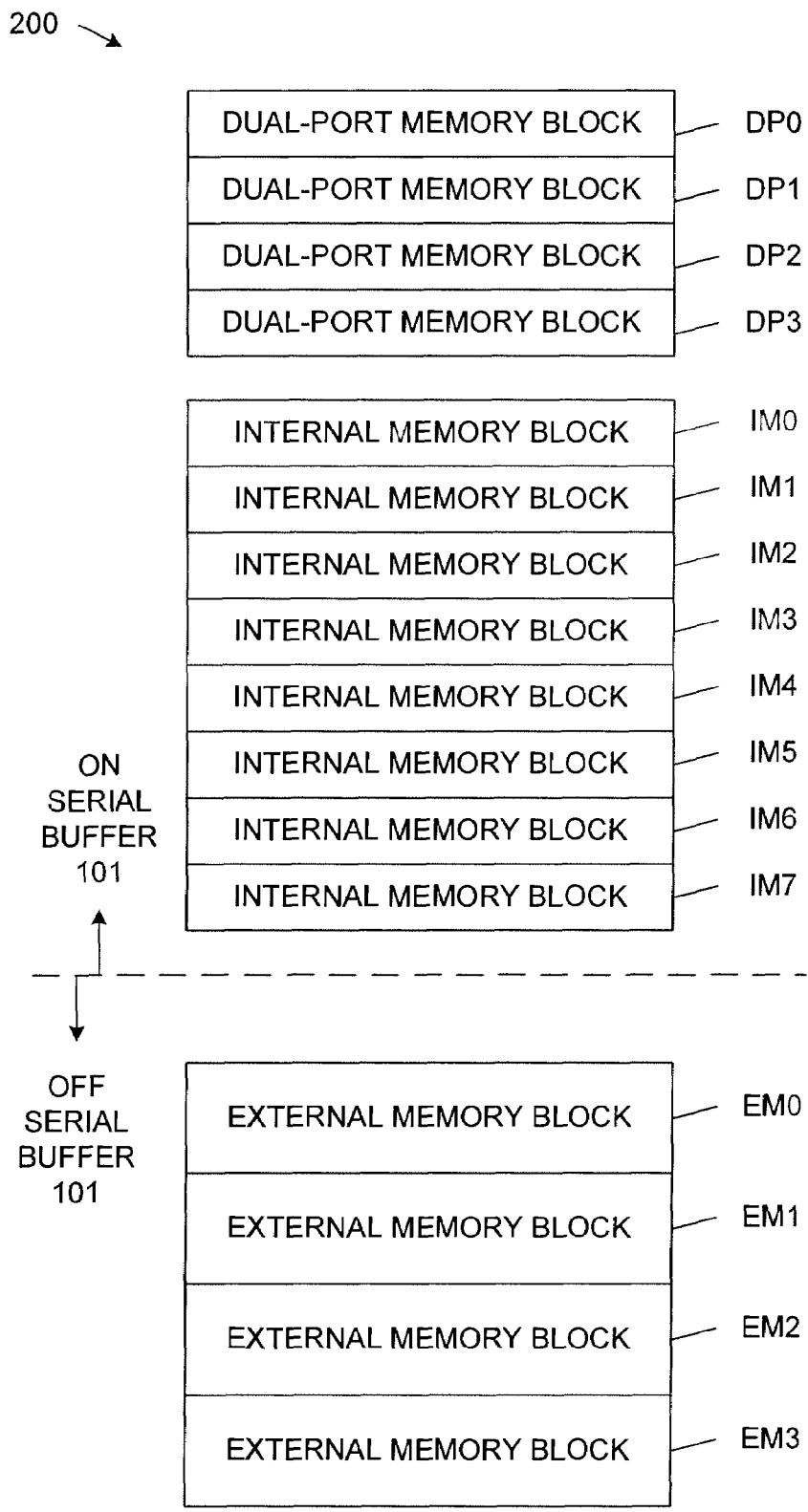
FIG. 2 is a block diagram of physical memory blocks used to implement virtual queues in accordance with one embodiment of the present invention.

FIG. 2 is a block diagram of physical memory blocks 200 used to implement the virtual queues VQ0-VQ7 in accordance with one embodiment of the present invention. Physical memory blocks 200 includes four dual-port memory blocks DP0, DP1, DP2 and DP3, eight internal memory blocks IM0, IM1, IM2, IM3, IM4, IM5, IM6, IM7, and four external memory blocks EM0, EM1, EM2 and EM3. Although specific numbers of physical memory blocks are used to describe the present invention, it is understood that other numbers of physical memory blocks may be used in other embodiments. In the described examples, each of dual-port memory blocks DP0-DP3 is located on the same chip as serial buffer 100, and has a relatively small capacity, which is defined by the value, dp_block_size. In the described examples, dp_block_size is 64, thereby indicating that each of the dual-port memory blocks DP0-DP3 has a capacity defined by 64 addressable entries (e.g., 64 double-words or 4 kbits). Note that dp_block_size can have other values in other embodiments.

In the described embodiments, each of the internal memory blocks IM0-IM7 is also located on the same chip as serial buffer 100, and has in intermediate capacity, which is defined by the value, im_block_size, and a corresponding multiplier value (cfg_, im_size). In the described examples, each of the internal memory blocks IM0-IM7 has a capacity defined by either 16 k addressable entries (e.g., 16 k double-words or 1 Mbit), or by 32 k addressable entries (e.g., 32 k double-words or 2 Mbits).

In the described embodiments, none of the external memory blocks EM0-EM3 are located on the same chip as serial buffer 100. Rather, the external memory blocks EM0-EM3 are connected to serial buffer 100 by a conventional routing structure (e.g., printed circuit board connection). Each of the external memory blocks EM0-EM3 has a relatively large capacity, which is defined by the value, em_block_size, and a corresponding multiplier value (cfg_em_size[1:0]). In the described examples, each of the external memory blocks EM0-EM3 has a capacity defined by: 128 k addressable entries (e.g., 128 k double-words or 8 Mbits); 256 addressable entries (e.g., 256 k double-words or 16 Mbits) with an external memory multiplier of 2×; 512 k addressable entries (e.g., 512 k double-words or 32 Mbits) with an external memory multiplier of 3×; or 1024 k addressable entries (e.g., 1024 k double-words or 64 Mbits) with an external memory multiplier of 4×.

As described below, the physical memory blocks 200 are allocated to implement the virtual queues VQ0-VQ7 in response to virtual queue configuration bits stored in memory configuration registers 113.

Figure 3A:
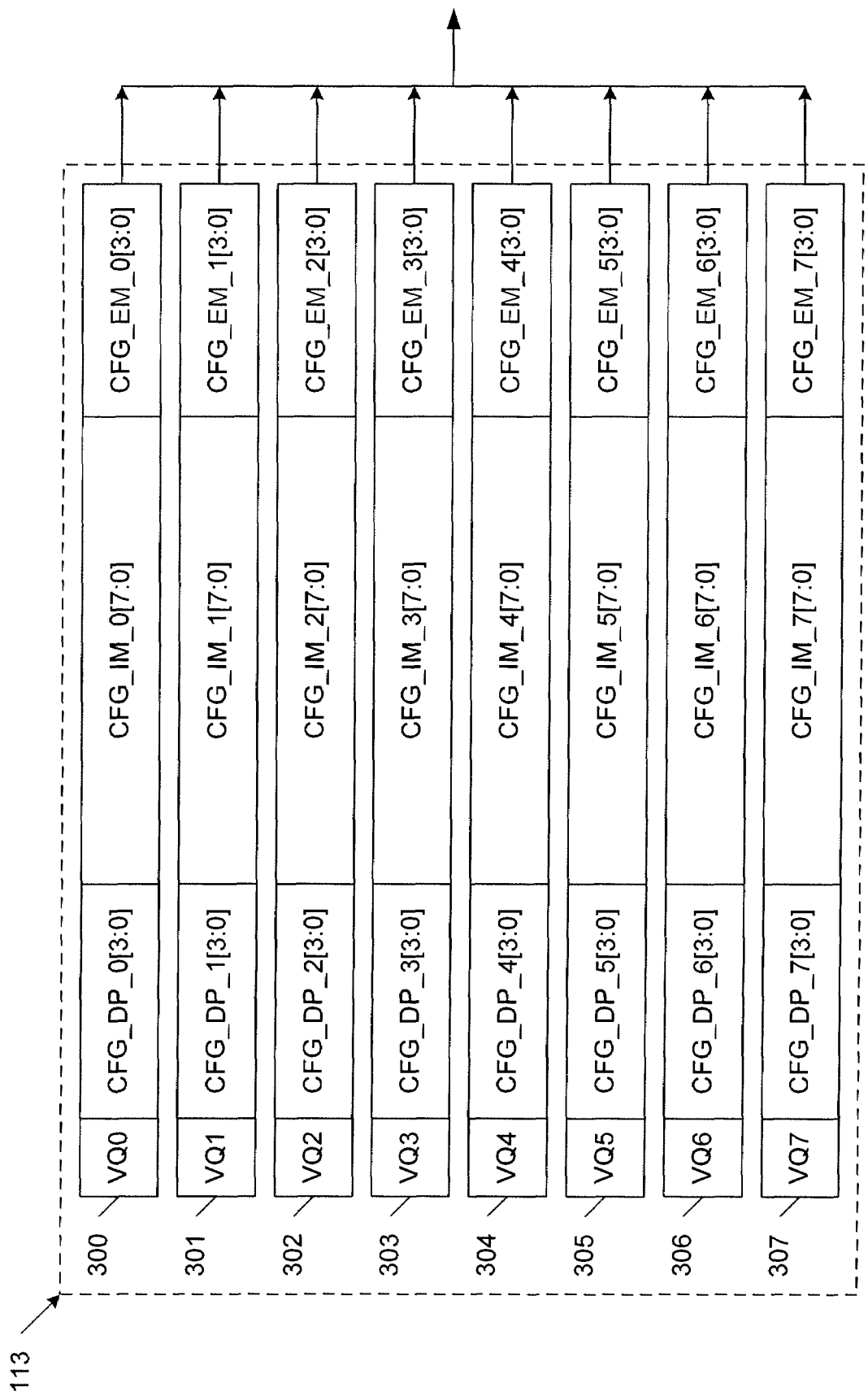
FIG. 3A is a block diagram illustrating configuration registers used to allocate physical memory blocks to virtual queues in accordance with one embodiment of the present invention.

FIG. 3A is a block diagram illustrating memory configuration registers 113 in accordance with one embodiment of the present invention. Memory configuration registers 113 include eight virtual queue configuration registers 300-307. These virtual queue configuration registers 300-307 define the allocation of physical memory blocks 200 for virtual queues VQ0-VQ7, respectively. For example, virtual queue configuration register 304 stores virtual queue configuration bits that specify which of the physical memory blocks 200 are allocated to implement virtual queue VQ4.

In the described embodiments, each of the virtual queue configuration registers 300-307 stores 16 corresponding virtual queue configuration bits arranged in three fields. The first field of each of the queue configuration registers 300-307 is a 4-bit field that defines the allocation of the four dual-port memory blocks DP0-DP3. The four configuration bits stored in the first field of each of the queue configuration registers 300-307 are labeled CFG_DP_n[3:0], wherein the integer 'n' represents the corresponding virtual queue.

The second field of each of the queue configuration registers 300-307 is an 8-bit field that defines the allocation of the eight internal memory blocks IM0-IM7. The eight configuration bits stored in the second field of each of the queue configuration registers 300-307 are labeled CFG_IM_n[7:0], wherein the integer 'n' represents the corresponding virtual queue.

The third field of each of the queue configuration registers 300-307 is a 4-bit field that defines the allocation of the four external memory blocks EM0-EM3. The four configuration bits stored in the third field of each of the queue configuration registers 300-307 are labeled CFG_EM_n[3:0], wherein the integer 'n' represents the corresponding virtual queue.

Within memory configuration registers 113, a virtual queue configuration bit having a logic '1' state indicates correspondence between one of the physical memory blocks 200 and one of the virtual queues VQ0-VQ7. This correspondence is described in more detail below in connection with a specific example provided by FIGS. 3B and 3C.

Figure 3B:
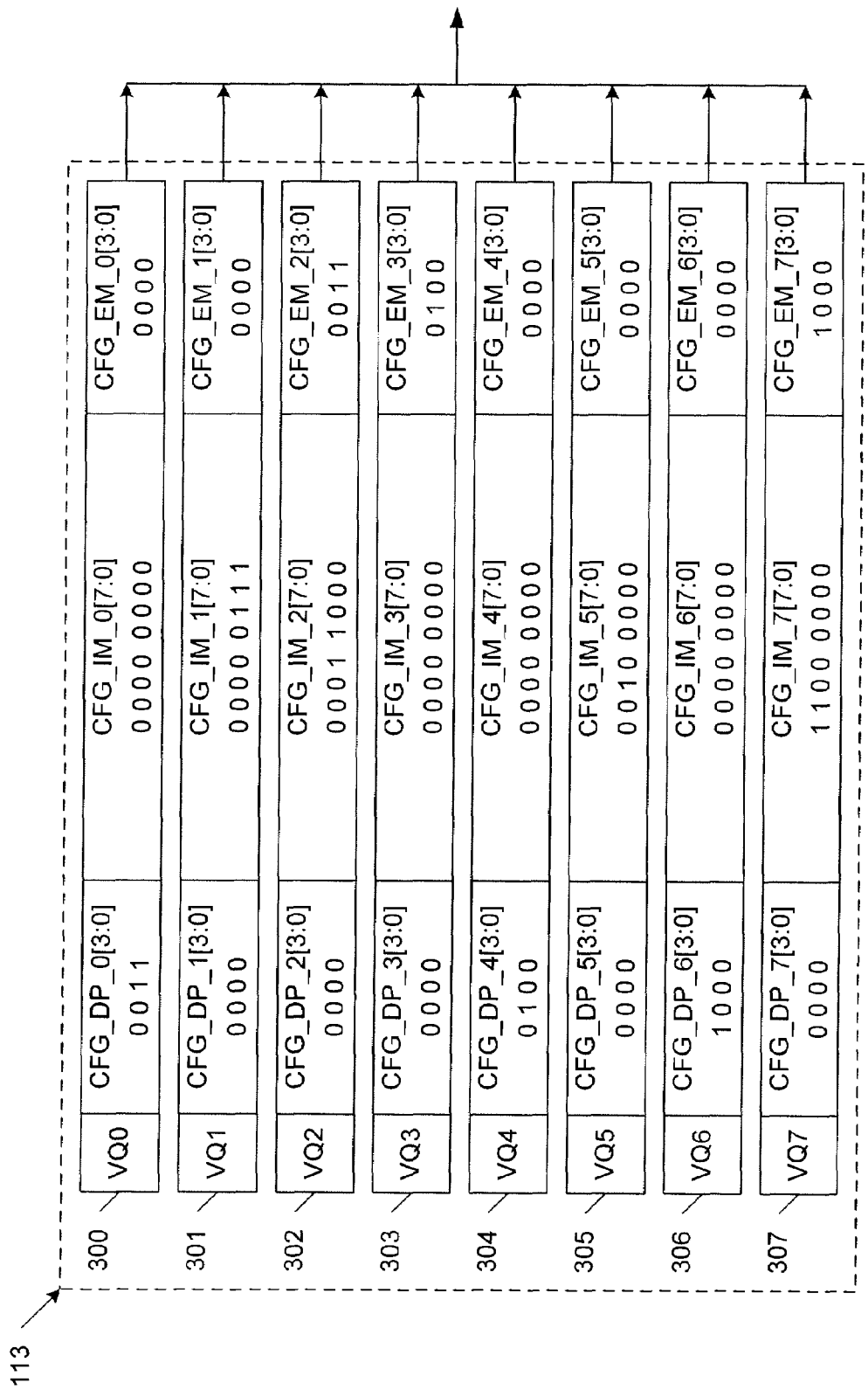
FIG. 3B is a block diagram that illustrates specific configuration bits stored in the configuration registers of FIG. 3A, thereby providing a specific example of allocating physical memory blocks to virtual queues in accordance with one embodiment of the present invention.
Figure 3C:
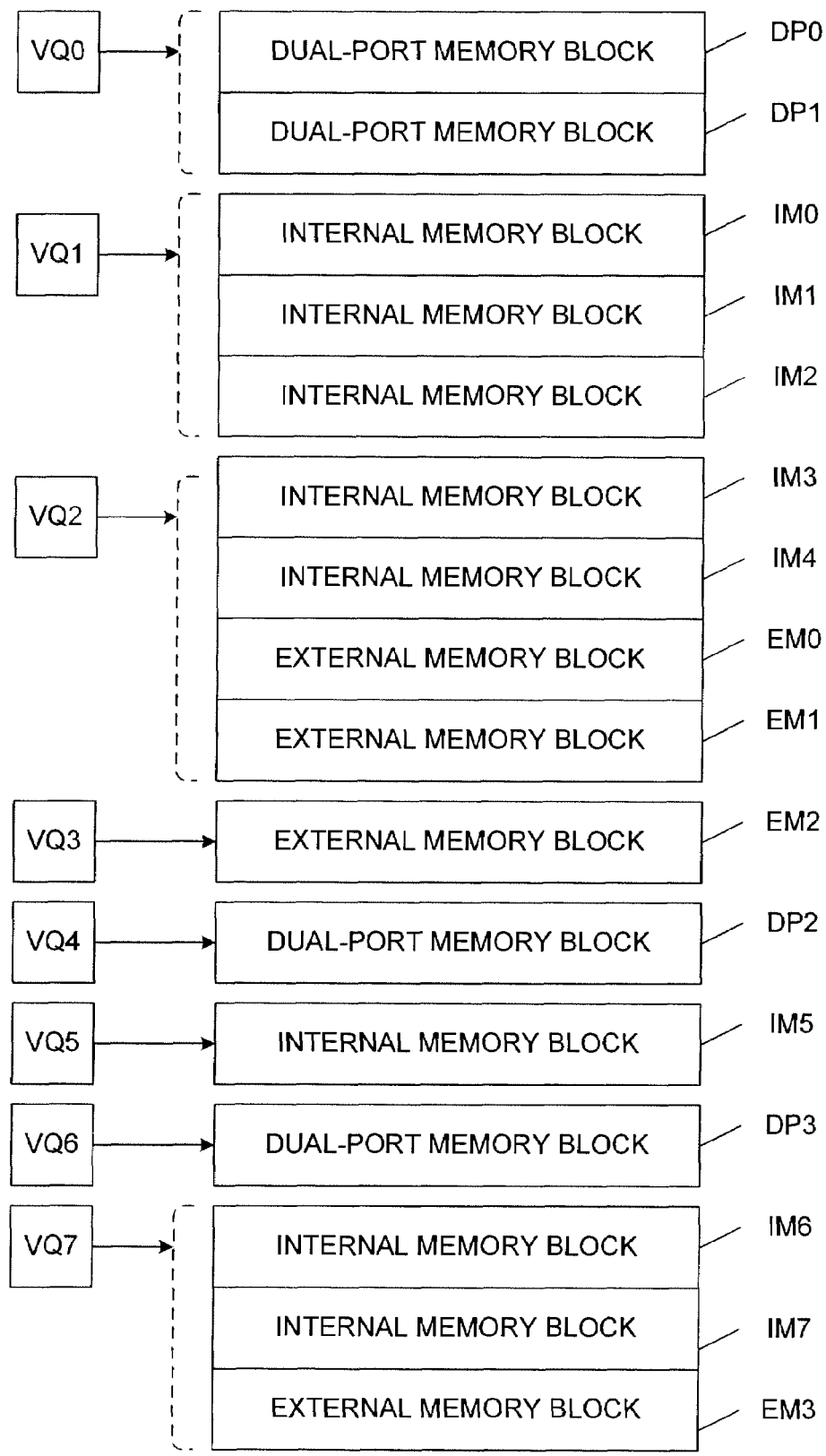
FIG. 3C is a block diagram that illustrates the manner in which various physical memory blocks are allocated to virtual queues in response to the specific configuration bits of FIG. 3B.

FIG. 3B is a block diagram that illustrates the virtual queue configuration bits stored in virtual queue configuration registers 300-307 in accordance with one embodiment of the present invention. FIG. 3C is a block diagram that illustrates the manner in which the various physical memory blocks 200 are allocated to the virtual queues VQ0-VQ7 in response to the virtual queue configuration bits of FIG. 3B. Although the virtual queue configuration bits implement one possible allocation of the physical memory blocks 200 to the virtual queues VQ0-VQ7, it is understood that the virtual queue configuration bits can be selected to implement many other allocations.

As illustrated in FIG. 3B, the virtual queue configuration register 300 associated with virtual queue VQ0 stores configuration bits CFG_DP_0[3:0] having a value of '0011'. The logic '1' states of configuration bits CFG_DP_0[1:0] indicate that dual port memory blocks DP1 and DP0 are allocated to virtual queue VQ0. This relationship is illustrated graphically in FIG. 3C. In accordance with the described embodiments, if one or more of dual-port memory blocks DP0-DP3 is allocated to a specific virtual queue, then none of the internal memory blocks IM0-IM7 and none of the external memory blocks EM0-EM3 can be allocated to this same virtual queue. Thus, the virtual queue Q0 stores configuration bits CFG_IM_0[3:0] having a value of '0000 0000' (which indicates that none of the internal memory blocks IM0-IM7 are allocated to virtual queue VQ0), and also stores configuration bits CFG_EM_0[3:0] having a value of '0000' (which indicates that none of the external memory blocks EM0-EM3 are allocated to virtual queue VQ0). Although two of the dual-port memory blocks are allocated to virtual queue VQ0 in the described example, it is understood that other numbers of the dual-port memory blocks can be allocated to virtual queue VQ0 (or any of the virtual queues VQ1-VQ7). However, each of the dual-port memory blocks DP0-DP3 can only be assigned, at most, to a single corresponding virtual queue (i.e., the same dual port memory block cannot be assigned to more than one of the virtual queues VQ0-VQ7).

In the present example, the two remaining dual port memory blocks DP2 and DP3 are allocated to virtual queues VQ4 and VQ6, respectively, by the contents of virtual queue configuration register 304 (CFG_DP_4[3:0]='0100') and virtual queue configuration register 306 (CFG_DP_6[3:0]='1000'), respectively. Because dual port memory blocks are allocated to virtual queues VQ4 and VQ6, no internal or external memory blocks are allocated to these virtual queues VQ4 and VQ6. This allocation of virtual queues VQ4 and VQ6 is illustrated graphically in FIG. 3C.

As illustrated in FIG. 3B, the virtual queue configuration register 301 associated with virtual queue VQ1 stores configuration bits CFG_IM_1[7:0] having a value of '0000 0111'. The logic '1' states of configuration bits CFG_IM_1[2:0] indicate that internal memory blocks IM2, IM1 and IM0 are allocated to virtual queue VQ1. Virtual queue configuration register 301 also stores configuration bits CFG_EM_1[3:0] having a value of '0000', which indicates that none of the external memory blocks EM0-EM3 is allocated to virtual queue VQ1. In addition, virtual queue configuration register 301 stores configuration bits CFG_DP_1[3:0] having a value of '0000', which indicates that none of the dual port memory blocks DP0-DP3 is allocated to virtual queue VQ1. The allocation of internal memory blocks IM0-IM2 to virtual queue VQ1 is illustrated graphically in FIG. 3C. This example shows how a virtual queue can be created using only internal memory blocks. Although three of the internal memory blocks are allocated to virtual queue VQ1 in the described example, it is understood that other numbers of the internal memory blocks can be allocated to virtual queue VQ1 (or any of the virtual queues VQ0, VQ2-VQ7) in other embodiments. However, each of the internal memory blocks IM0-IM7 can only be assigned, at most, to a single corresponding virtual queue.

As further illustrated in FIG. 3B, the virtual queue configuration register 302 associated with virtual queue VQ2 stores configuration bits CFG_IM_2[7:0] having a value of '0001 1000', and configuration bits CFG_EM_2[3:0] having a value of '0011'. The logic '1' states of configuration bits CFG_IM_2[4:3] indicate that internal memory blocks IM4 and IM3 are allocated to virtual queue VQ2. Similarly, the logic '1' states of configuration bits CFG_EM_2[1:0] indicate that external memory blocks EM1 and EM0 are also allocated to virtual queue VQ2. Virtual queue configuration register 302 also stores configuration bits CFG_DP_2[3:0] having a value of '0000', which indicates that none of the dual port memory blocks DP0-DP3 is allocated to virtual queue VQ2. The allocation of internal memory blocks IM3-IM4 and external memory blocks EM0-EM1 to virtual queue VQ2 is illustrated graphically in FIG. 3C. This example shows how a virtual queue can be created using both internal memory blocks and external memory blocks. Although two of the internal memory blocks and two of the external memory blocks are allocated to virtual queue VQ2 in the described example, it is understood that other numbers of the internal memory blocks and the external memory blocks can be allocated to virtual queue VQ2 (or any of the virtual queues VQ0-VQ1, VQ3-VQ7) in other embodiments. However, each of the internal memory blocks IM0-IM7 and external memory blocks EM0-EM1 can only be assigned, at most, to a single corresponding virtual queue.

As further illustrated in FIG. 3B, the virtual queue configuration register 303 associated with virtual queue VQ3 stores configuration bits CFG_EM_3[3:0] having a value of '0100'. The logic '1' state of configuration bit CFG_EM_3 [2] indicates that external memory block EM2 is allocated to virtual queue VQ3. Virtual queue configuration register 301 also stores configuration bits CFG_IM_3 [7:0] having a value of '0000 0000', which indicates that none of the internal memory blocks IMO-IM7 is allocated to virtual queue VQ3, and configuration bits CFG_DP_3 [3:0] having a value of '0000', which indicates that none of the dual port memory blocks DPO-DP3 is allocated to virtual queue VQ3. The allocation of external memory block EM2 to virtual queue VQ3 is illustrated graphically in FIG. 3C. This example shows how a virtual queue can be created using only external memory blocks. Although one external memory block is allocated to virtual queue VQ3 in the described example, it is understood that other numbers of the external memory blocks can be allocated to virtual queue VQ3 (or any of the virtual queues VQ0-VQ2, VQ4-VQ7) in other embodiments. However, each of the external memory blocks EMO-EM3 can only be assigned, at most, to a single corresponding virtual queue.

In a similar manner, virtual queue configuration register 305 stores configuration bits that allocate internal memory block IM5 to virtual queue VQ5, and virtual queue configuration register 307 stores configuration bits that allocate internal memory blocks IM6-IM7 and external memory block EM3 to virtual queue VQ7. Although each of the virtual queues is assigned at least one of physical memory blocks 200 in the illustrated example, it is understood that in other embodiments one or more of the virtual queues may be unused (i.e., have no assigned physical memory blocks).

In yet other embodiments, external memory blocks EM0-EM3 may not be present (i.e., when there is no external memory device connected to serial buffer 100 to provide the external memory blocks EM0-EM3.)

To summarize, internal memory blocks IM0-IM7 and external memory blocks EM0-EM3 can be intermixed and allocated to any virtual queue (as long as a dual-port memory block is not allocated to the same virtual queue). Also in accordance with the described embodiments, each physical memory block can only be allocated to a single virtual queue (i.e., each physical memory block can only be used once in any configuration).

As described below, memory size register 112 is used to specify the total size of internal memory blocks IM0-IM7 (i.e., the internal memory size) and specify the total size of external memory blocks EM0-EM3 (e.g., the external memory size). The size of each of the internal memory blocks IM0-IM7 can be determined by dividing the specified internal memory size by eight. Similarly, the size of each of the external memory blocks EM0-EM3 can be determined by dividing the specified external memory size by four.

The internal memory size is selected to determine how much of an available on-chip memory capacity is used to implement internal memory blocks IM0-IM7. In some applications, it may be desirable to use the maximum available on-chip memory capacity to implement the internal memory blocks IM0-IM7 (e.g., when there is no external memory connected to serial buffer 100, or when it is desirable to maximize the amount of available low access latency memory). In other applications, it may be desirable to implement smaller internal memory blocks in order to make the unused on-chip memory capacity available to other functions of the serial buffer.

The external memory size is selected to identify the memory capacity of an external memory device that will be used to implement the external memory blocks EM0-EM3. Note that the external memory device must have a total memory capacity at least as large as the specified external memory size.

Figure 4:
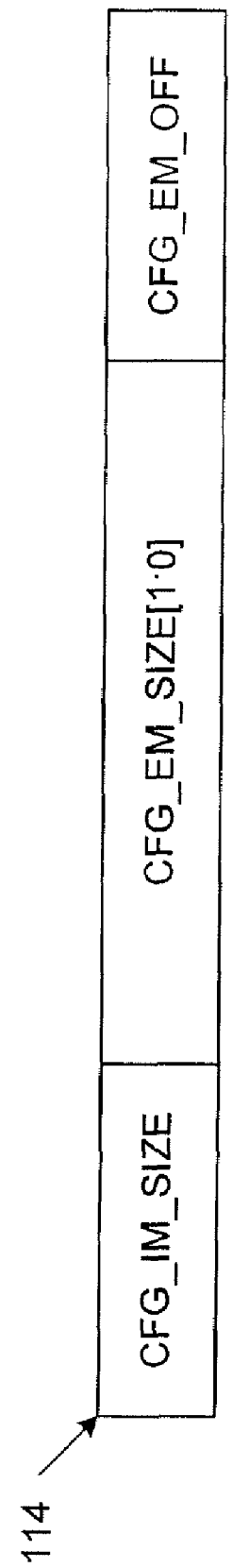
FIG. 4 is a block diagram illustrating a memory size register in accordance with one embodiment of the present invention.

FIG. 4 is a block diagram illustrating memory size register 114 in accordance with one embodiment of the present invention. Memory size register stores a 1-bit internal memory size indicator CFG_IM_SIZE, a 2-bit external memory size indicator CFG_EM_SIZE[1:0], and a 1-bit external memory absent indicator CFG_EM_OFF.

In the described examples, the internal memory size indicator CFG_IM_SIZE can be set to a logic '1' value to specify a relatively small internal memory size of 8 Mbits, such that each of the internal memory blocks IM0-IM7 has a capacity of 1 Mbit. Alternately, the internal memory size indicator CFG_IM_SIZE can be set to a logic '0' value to specify a relatively large internal memory size of 16 Mbits, such that each of the internal memory blocks IM0-IM7 has a capacity of 2 Mbits.

In the described examples, the external memory size indicator CFG_EM_SIZE[1:0] can be set to logic values of '00', '01', '10' or '11' to specify external memory sizes of 32 Mbits, 64 Mbits, 128 Mbits or 256 Mbits, respectively, such that each of the external memory blocks EM0-EM3 has a capacity of 8, 16, 32 or 64 Mbits, respectively.

In the described examples, the external memory absent indicator CFG_EM_OFF can have a logic '1' value to indicate that no external memory is connected to serial buffer 100, or a logic '0' value to indicate that an external memory is connected to serial buffer. If the external memory absent indicator CFG_EM_OFF is activated to a logic '1' value, then the external memory size indicator CFG_EM_SIZE[1:0] is rendered meaningless, and any virtual queue configuration bits allocating external memory blocks to virtual queues are ignored. However, if the external memory absent indicator CFG_EM_OFF is deactivated to a logic '0' value, then external memory size indicator CFB_EM_SIZE[1:0] is valid.

The above-described contents of virtual queue configuration registers 113 and memory size register 114 are provided to write memory mapper 111 and read memory mapper 112. As described in more detail below, write control circuit 101 initiates write operations to the virtual queues VQ0-VQ7 by providing a virtual queue write enable signal and a corresponding virtual queue write pointer (address) value to write memory mapper 111. In response, write memory mapper 111 causes a write operation to be performed to an appropriate one of the physical memory blocks 200 (as determined by the virtual queue write enable signal, the corresponding virtual queue write pointer value, the virtual queue configuration bits and the contents of memory size register 114).

Similarly, read control circuit 102 initiates read operations to the virtual queues VQ0-VQ7 by providing a virtual queue read enable signal and a corresponding virtual queue read pointer (address) value to read memory mapper 112. In response, read memory mapper 112 causes a read operation to be performed from an appropriate one of the physical memory blocks 200 (as determined by the virtual queue read enable signal, the corresponding virtual queue read pointer value, the virtual queue configuration bits and the contents of memory size register 1114).

Figure 5:
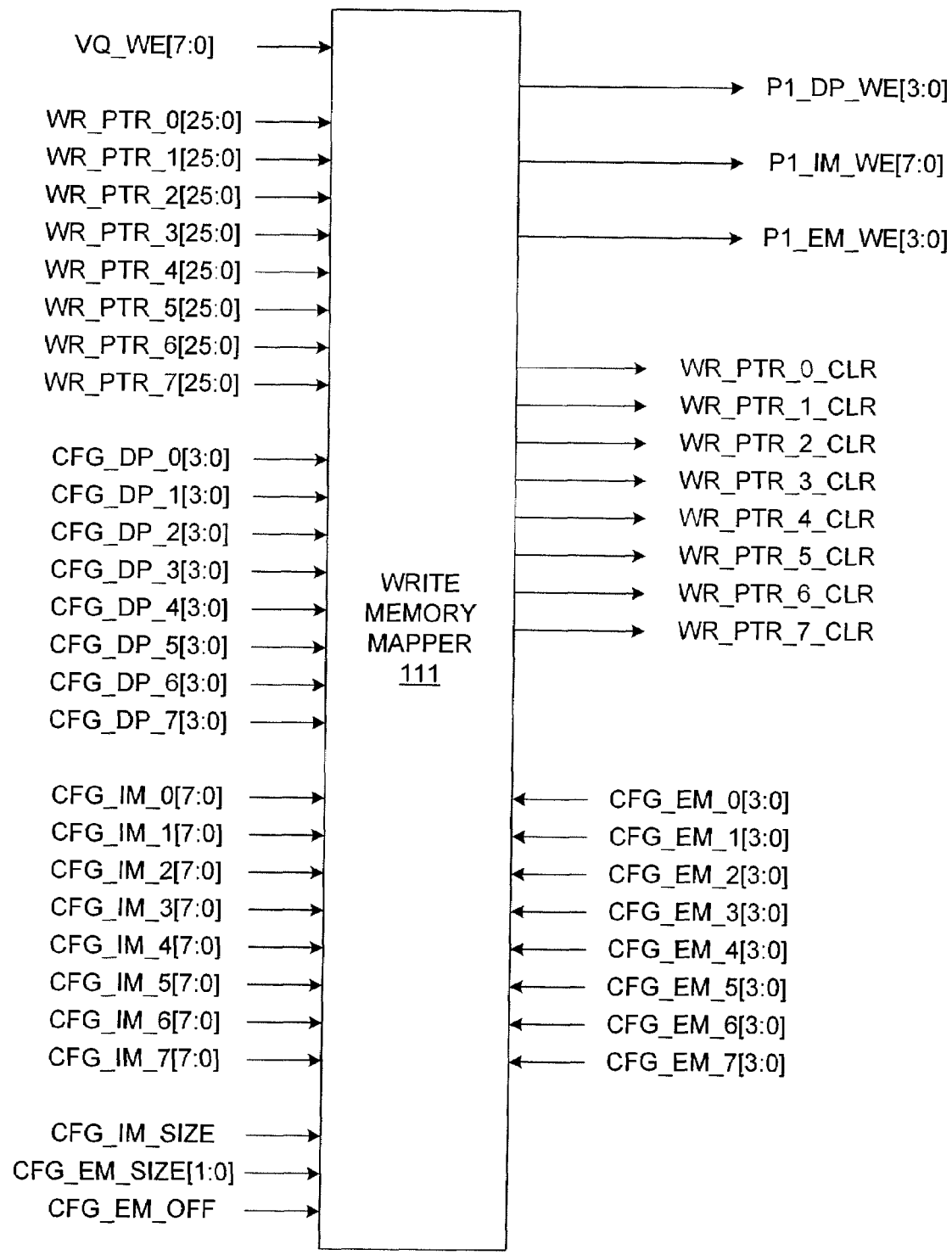
FIG. 5 is a block diagram of a write memory mapper in accordance with one embodiment of the present invention.

FIG. 5 is a block diagram of write memory mapper 111, in accordance with one embodiment of the present invention. Write memory mapper 111 receives the contents of virtual queue configuration registers 113 and memory size register 114, as illustrated. In addition, write memory mapper 111 receives virtual queue write enable signals VQ_WE[0], VQ_WE[1], VQ_WE[2], VQ_WE[3], VQ_WE[4], VQ_WE[5], VQ_WE[6] and VQ_WE[7] from write control circuit 101. Write control circuit 101 activates the virtual queue write enable signals VQ_WE[0], VQ_WE[1], VQ_WE[2], VQ_WE[3], VQ_WE[4], VQ_WE[5], VQ_WE[6] and VQ_WE[7] to initiate write operations to virtual queues VQ0, VQ1, VQ2, VQ3, VQ4, VQ5, VQ6 and VQ7, respectively.

Write memory mapper 111 also receives virtual queue write pointer values WR_PTR_0[25:0], WR_PTR_1[25:0], WR_PTR_2[25:0], WR_PTR_3[25:0], WR_PTR_4[25:0], WR_PTR_5[25:0], WR_PTR_6[25:0] and WR_PTR_7[25:0] from write control circuit 101. The virtual queue write pointer values WR_PTR_0[25:0], WR_PTR_1[25:0], WR_PTR_2[25:0], WR_PTR_3[25:0], WR_PTR_4[25:0], WR_PTR_5[25:0], WR_PTR_6[25:0] and WR_PTR_7[25:0] specify the write addresses of the next write accesses to virtual queues VQ0, VQ1, VQ2, VQ3, VQ4, VQ5, VQ6 and VQ7, respectively.

In general, write memory mapper 111 identifies which one of the physical memory blocks 200 should be accessed in response to the received signals, and in response, activates a physical memory write enable signal to enable this physical memory block. More specifically, write memory mapper 111 provides physical memory write enable signals P1_DP_WE[3:0] to enable write accesses to dual-port memory blocks DP3-DP0, respectively. Similarly, write memory mapper 111 provides physical memory write enable signals P1_IM_WE[7:0] to enable write accesses to internal memory blocks IM7-IM0, respectively. In addition, write memory mapper 111 provides physical memory write enable signals P1_EM_WE[3:0] to enable write accesses to external memory blocks EM3-EM0, respectively.

Write memory mapper 111 also provides write pointer clear signals WR_PTR_0_CLR, WR_PTR_1_CLR, WR_PTR_2_CLR, WR_PTR_3_CLR, WR_PTR_4_CLR, WR_PTR_5_CLR, WR_PTR_6_CLR, and WR_PTR_7_CLR, which are activated to clear the write pointer values WR_PTR_0[25:0], WR_PTR_1[25:0], WR_PTR_2[25:0], WR_PTR_3[25:0], WR_PTR_4[25:0], WR_PTR_5[25:0], WR_PTR_6[25:0] and WR_PTR_7[25:0], respectively.

Write memory mapper 111 operates as follows in accordance with one embodiment of the present invention. The capacity of each of the virtual queues VQ0-VQ7 is initially identified. The manner in which write memory mapper 111 identifies the capacity of virtual queue VQ0 will be described in detail, with the understanding that the capacities of virtual queues VQ1-VQ7 will be determined in the same manner.

Write memory mapper 111 initially calculates the total number of dual port memory blocks assigned to virtual queue VQ0 (i.e., dp0_total) using the following equation.

$$dp0\_total = CFG\_DP\_0[0] + CFG\_DP\_0[1] + CFG\_DP\_0[2] + CFG\_DP\_0[3] \quad (1)$$

Write memory mapper 111 then calculates the total size of the dual port memory blocks assigned to virtual queue VQ0 (i.e., dp0_size) using the following equation (wherein dp_block_size is the size of a single dual port memory block (i.e., 64 double-words in the described example)).

$$dp0\_size = dp\_block\_size * dp0\_total \quad (2)$$

Write memory mapper 111 also calculates the total number of internal memory blocks assigned to virtual queue VQ0 (i.e., im0_total) using the following equation.

$$im0\_total = CFG\_IM\_0[0] + CFG\_IM\_0[1] + CFG\_IM\_0[2] + CFG\_IM\_0[3] + CFG\_IM\_0[4] + CFG\_IM\_0[5] + CFG\_IM\_0[6] + CFG\_IM\_0[7] \quad (3)$$

In addition, write memory mapper 111 calculates the total number of external memory blocks assigned to virtual queue VQ0 (i.e., em0_total) using the following equation.

$$em0\_total = CFG\_EM\_0[0] + CFG\_EM\_0[1] + CFG\_EM\_0[2] + CFG\_EM\_0[3] \quad (4)$$

Write memory mapper 111 then calculates the total size of the internal and external memory blocks assigned to virtual queue VQ0 (i.e., imem0_size) using the following equation, wherein im_block_size represents the number of entries in the smallest available internal memory block (i.e., 16 k double-words in the described examples), and em_block_size represents the number of entries in the smallest available external memory block (i.e., 128 k double-words in the described examples).

$$imem0\_size = im\_block\_size * im0\_total * (\sim CFG\_IM\_SIZE+1) + em\_block\_size * em0\_total * (CFG\_EM\_SIZE[1:0]+1) \quad (5)$$

Note that an internal memory size indicators (CFG_IM_SIZE) having a values of '0' and '1' will provide multiplication factors of 2× and 1×, respectively. Similarly, external memory size indicators (CFG_EM_SIZE[1:0]) having values of '00', '01', '10' and '11' will provide multiplication factors of 1×, 2×, 3× and 4×, respectively.

Because virtual queue VQ0 can include dual-port memory blocks or internal/external memory blocks, but not both, only one of the values dp0_size or imem0_size can have a non-zero value (and at least one of these values will have a zero value). Accordingly, write memory mapper 111 can identify the capacity of virtual queue VQ0 by performing a logical OR function that uses the calculated dp0_size value and imem0_size value as inputs. This operation is represented by the following equation.

$$VQ0\_size = dp0\_size | imem0\_size \quad (6)$$

Write memory mapper 111 uses the calculated VQ0_size value to set a condition for clearing the virtual queue write pointer value WR_PTR_0[25:0] associated with virtual queue VQ0. More specifically, write memory mapper 111 clears the virtual queue write pointer value WR_PTR_0[25:0] when this write pointer value reaches the end of the memory space defined by the VQ0_size value. Write memory mapper 111 clears the virtual queue write pointer value WR_PTR_0[25:0] by activating a corresponding write pointer clear signal, WR_PTR_0_CLR. Because the virtual queue write pointer value WR_PTR_0[25:0] starts at zero, and the VQ0_size value identifies the number address locations in virtual queue VQ0, the write pointer clear signal WR_PTR_0_CLR is activated when the write pointer value WR_PTR_0[25:0] reaches a value equal to the VQ0 size value minus 1. The generation of the write pointer clear signal is represented by the following equation.

$$WR\_PTR\_0\_CLR = (WR\_PTR\_0[25:0] == (VQ0\_size-1)) \quad (7)$$

The sizes of virtual queues VQ1 to VQ7 (i.e., VQ1_size to VQ7_size) are calculated in the same manner that the size of virtual queue VQ0 is calculated. The conditions for activating the corresponding write pointer clear signals (WR_PTR_1_CLR to WR_PTR_7_CLR) are determined in response to the respective calculated queue size values (VQ1_size to VQ7_size) in the same manner that the conditions for activating the write pointer clear signal WR_PTR_0_CLR are determined in response to the calculated queue size value VQ0_size.

FIG. 6 is a table 600 that shows the virtual queue sizes of the virtual queues VQ0-VQ7 defined by the example of FIGS. 3B and 3C, wherein the internal memory size indicator CFG_IM_SIZE is equal to '0', the external memory size indicator CFG_EM_SIZE is equal to '01', and the external memory absent indicator CFG_EM_OFF is equal to '0'.

The manner in which write memory mapper 111 generates the physical memory write enable signals P1_DP_WE[3:0], P1_IM_WE[7:0] and P1_EM_WE[3:0] to enable write accesses to the physical memory blocks 200, will now be described.

To implement a write access to virtual queue VQ0, write control circuit 101 activates the virtual queue write enable signal VQ_WE[0] associated with virtual queue VQ0. The write pointer value WR_PTR_0[25:0] associated with virtual queue VQ0 is initially zero. Upon detecting that the virtual queue write enable signal VQ_WE[0] has been activated, write memory mapper 111 determines whether any of dual-port memory blocks DP0-DP3 have been assigned to virtual queue VQ0, by determining whether one or more of the configuration bits CFG_DP_0[3:0] is set to a logic '1' state. In the example illustrated in FIGS. 3B and 3C, dual-port memory blocks DP0 and DP1 have been assigned to virtual queue VQ0.

If write memory mapper 111 determines that one or more dual-port memory blocks DP0-DP3 have been assigned to virtual queue VQ0, processing proceeds as follows. Write memory mapper 111 identifies a first dual port memory block assigned to virtual queue VQ0, which in the present example is dual-port memory block DP0. Write memory mapper 111 activates the physical memory write enable signal associated with this identified dual port memory block, which in the present example is P1_DP_WE[0]. Write memory mapper 111 continues to activate this dual-port memory block write enable signal P1_DP_WE[0] as long as write operations are performed to virtual queue VQ0 and the corresponding write pointer value WR_PTR_0[25:0] has not yet reached the dp_block_size, which is 64 in the present example.

When the write pointer value WR_PTR_0[25:0] reaches the dp_block_size, write memory mapper 111 identifies a second dual port memory block assigned to virtual queue VQ0, which in the present example is dual-port memory block DP1. Write memory mapper 111 activates the dual-port memory block write enable signal associated with this identified dual port memory block, which in the present example is P1_DP_WE[1], and de-activates the previously activated dual-port memory block write enable signal (i.e., P1_DP_WE[0] in the present example). In this manner, the next write operation is performed to the first address location of the second dual-port memory block DP1.

Note that if there was not a second dual port memory block assigned to virtual queue VQ0, the write pointer value WR_PTR_0[25:0] would be reset to zero upon reaching the dp_block_size, and the next write operation would be performed to the first address location of dual-port memory block DP0.

Returning to the present example, write memory mapper 111 continues to activate the dual-port memory block write enable signal P1_DP_WE[1] associated with the second dual port memory block DP1 for write operations to virtual queue VQ0, as long as the corresponding write pointer value WR_PTR_0[25:0] has not yet reached a value equal to twice the dp_block_size, which is 128 in the present example.

When the write pointer value WR_PTR_0[25:0] reaches a value equal to twice the dp_block_size, write memory mapper 111 determines that the write pointer value WR_PTR_0[25:0] has reached the end of virtual queue VQ0 (i.e., WR_PTR_0[25:0]=VQ0_size), and in response, activates the write pointer clear signal (WR_PTR_0_CLR) associated with virtual queue VQ0 in the manner described above. As a result, the write pointer value WR_PTR_0[25:0] is reset to zero, and the next write operation is performed to the first address location of the first dual-port memory block DP0.

The above-describe method of generating the write enable signals for dual port memory blocks allocated to virtual queue VQ0 can be summarized as follows.

---
P1_DP_WE[3:0] generation:
---
```
m = 1
for (i=0; i<=3; i=i+1)
    if(CFG_DP_0[i] = 1)
        begin
            if(wr_ptr_0 != dp_block_size * m) P1_DP_WE[i] =
                VQ_WE[0];
            m=m+1
        end
```
---

Write memory mapper 111 generates the write enable signals for dual-port memory blocks allocated to the other virtual queues VQ1-VQ7 in the same manner described above for virtual queue VQ0.

If write memory mapper 111 initially determines that none of the dual-port memory blocks DP0-DP3 have been assigned to the virtual queue VQ0 (i.e., none of the configuration bits CFG_DP_0[3:0] is set to a logic '1' state), then none of dual-port memory block write enable signals P1_DP_WE[3:0] will be activated, and write memory mapper 111 will determine whether any of the internal memory blocks IM0-IM7 and/or any of the external memory blocks EM0-EM3 have been assigned to the virtual queue Q0. Because both internal memory blocks and external memory blocks are allocated to virtual queue VQ2 in the example provided above in FIGS. 3B and 3C, write operations to virtual queue VQ2 will be now described for illustrative purposes.

To implement a write access to virtual queue VQ2, write control circuit 101 activates the virtual queue write enable signal VQ_WE[2] associated with virtual queue VQ2. The write pointer value WR_PTR_2[25:0] associated with virtual queue VQ2 is initially zero. Upon detecting that the virtual queue write enable signal VQ_WE[2] has been activated, write memory mapper 111 determines that none of the dual-port memory blocks DP0-DP3 have been assigned to virtual queue VQ2 by examining the configuration bits CFG_DP_2[3:0] in the manner described above. Also upon detecting that the virtual queue write enable signal VQ_WE[2] has been activated, write memory mapper 111 determines whether any of internal memory blocks IM0-IM7 have been assigned to virtual queue VQ2, by determining whether one or more of the configuration bits CFG_IM_2[7:0] have been set to a logic '1' state. Write memory mapper 111 also determines whether any of external memory blocks EM0-EM3 have been assigned to virtual queue VQ2, by determining whether one or more of the configuration bits CFG_EM_2[3:0] have been set to a logic '1' state. In the example illustrated in FIGS. 3B and 3C, internal memory blocks IM3-IM4 and external memory blocks EM0-EM1 have been assigned to virtual queue VQ2.

When write memory mapper 111 determines that one or more internal memory blocks IM0-IM7 have been assigned to virtual queue VQ2, processing proceeds as follows. Write memory mapper 111 identifies a first internal memory block assigned to virtual queue VQ2, which in the present example is internal memory block IM3. Write memory mapper 111 activates the physical memory write enable signal associated with this identified internal memory block, which in the present example is P1_IM_WE[3]. Write memory mapper 111 continues to activate this internal memory block write enable signal P1_IM_WE[3] for write accesses to virtual queue VQ2, as long as the corresponding write pointer value WR_PTR_2[25:0] has not yet reached a value equal to the programmed internal memory block size, which is equal to im_block_size*(~cfg_im_size+1), or 32 k in the present example.

When the write pointer value WR_PTR_2[25:0] reaches a the programmed internal memory block size, write memory mapper 111 identifies the next internal memory block assigned to virtual queue VQ2, which in the present example is internal memory block IM4. Write memory mapper 111 activates the write enable signal associated with this identified internal memory block, which in the present example is P1_IM_WE[4], and de-activates the previously activated internal memory block write enable signal (i.e., P1_IM_WE[3] in the present example). In this manner, the next write operation is performed to the first address location of the next internal memory block IM4.

Note that if there was not a second internal memory block assigned to virtual queue VQ2, and there were no external memory blocks assigned to virtual queue VQ2, the write pointer value WR_PTR_2[25:0] would be reset to zero upon reaching the programmed internal memory block size, and the next write operation would be performed to the first address location of the internal memory block IM3.

Returning to the present example, write memory mapper 111 continues to activate the internal memory block write enable signal P1_IM_WE[4] associated with the internal memory block IM4 for write operations to virtual queue VQ2, as long as the corresponding write pointer value WR_PTR_2 [25:0] has not yet reached a value equal to twice the programmed internal memory block size (e.g., 64 k in the present example).

When the write pointer value WR_PTR_2[25:0] reaches a value equal to twice the programmed internal memory block size, write memory mapper 111 determines that the write pointer value WR_PTR_2[25:0] has reached the full capacity of the internal memory blocks allocated to virtual queue VQ2. Because write memory mapper 111 has determined that there are one or more external memory blocks also assigned to virtual queue VQ2, processing will proceed as follows.

Write memory mapper 111 identifies a first external memory block assigned to virtual queue VQ2, which in the present example is external memory block EM0. Write memory mapper 111 activates the physical memory write enable signal associated with this identified external memory block, which in the present example is P1_EM_WE [0]. Write memory mapper 111 continues to activate this external memory block write enable signal P1_EM_WE[0] for write operations to virtual queue VQ2, as long as the corresponding write pointer value WR_PTR_2[25:0] has not yet reached the programmed external memory block size, which is equal to em_block_size* (cfg_em_size+1), or 256 k in the present example.

When the write pointer value WR_PTR_2[25:0] reaches the programmed external memory block size, write memory mapper 111 identifies the next external memory block assigned to virtual queue VQ2, which in the present example is external memory block EM1. Write memory mapper 111 activates the write enable signal associated with this identified external memory block, which in the present example is P1_EM_WE[1], and de-activates the previously activated external memory block write enable signal (i.e., P1_EM_WE [0] in the present example). In this manner, the next write operation to virtual queue VQ2 is performed to the first address location of the next external memory block EM1.

Note that if there was not a second external memory block assigned to virtual queue VQ2, the write pointer value WR_PTR_2[25:0] would be reset to zero upon reaching a value equal to the programmed external memory block size plus two times the programmed internal memory block size, and the next write operation would be performed to the first address location of the initial internal memory block IM3.

Returning to the present example, write memory mapper 111 continues to activate the external memory block write enable signal P1_EM_WE[1] associated with the external memory block EM1 for write operations to virtual queue VQ2, as long as the corresponding write pointer value WR_PTR_2[25:0] has not yet reached a value equal to two times the programmed internal memory block size plus two times the programmed external memory block size, which is 576 k in the present example.

When the write pointer value WR_PTR_2[25:0] reaches a value equal to two times the programmed internal memory block size plus two times the programmed external memory block size, write memory mapper 111 determines that the write pointer value WR_PTR_2[25:0] has reached the full capacity of the internal and external memory blocks allocated to virtual queue VQ2 (i.e., WR_PTR_2[25:0]=VQ2_size), and in response, activates the write pointer clear signal (WR_PTR_2_CLR) associated with virtual queue VQ2 in the manner described above. As a result, the write pointer value WR_PTR_2[25:0] is reset to zero, and the next write operation to virtual queue VQ2 is performed to the first address location of the internal memory block IM3.

The above-describe method of generating the write enable signals for internal and external memory blocks allocated to virtual queue VQ2 can be summarized as follows.

P1_IM_WE[7:0] and P1_EM_WE[3:0] generation:

```
m = 1;
for (i=0; i<=7; i=i+1)
    if(CFG_IM_2[i] = 1)
        begin
            if(wr_ptr_2 != im_block_size*(~cfg_im_size + 1)*m)
                P1_IM_WE[i] = VQ_WE[2];
            m=m+1
        end
m = 1;
for (k=0; k<=3; k=k+1)
    if(CFG_EM_2[k] = 1)
        begin
            if(wr_ptr_2 != em_block_size*(cfg_em_size + 1)*m)
                P1_EM_WE[i] = VQ_WE[2];
            m=m+1
        end
```

Write memory mapper 111 generates the write enable signals for internal and external memory blocks allocated to the other virtual queues VQ0-VQ1 and VQ3-VQ7 in the same manner described above for virtual queue VQ2.

Figure 7:
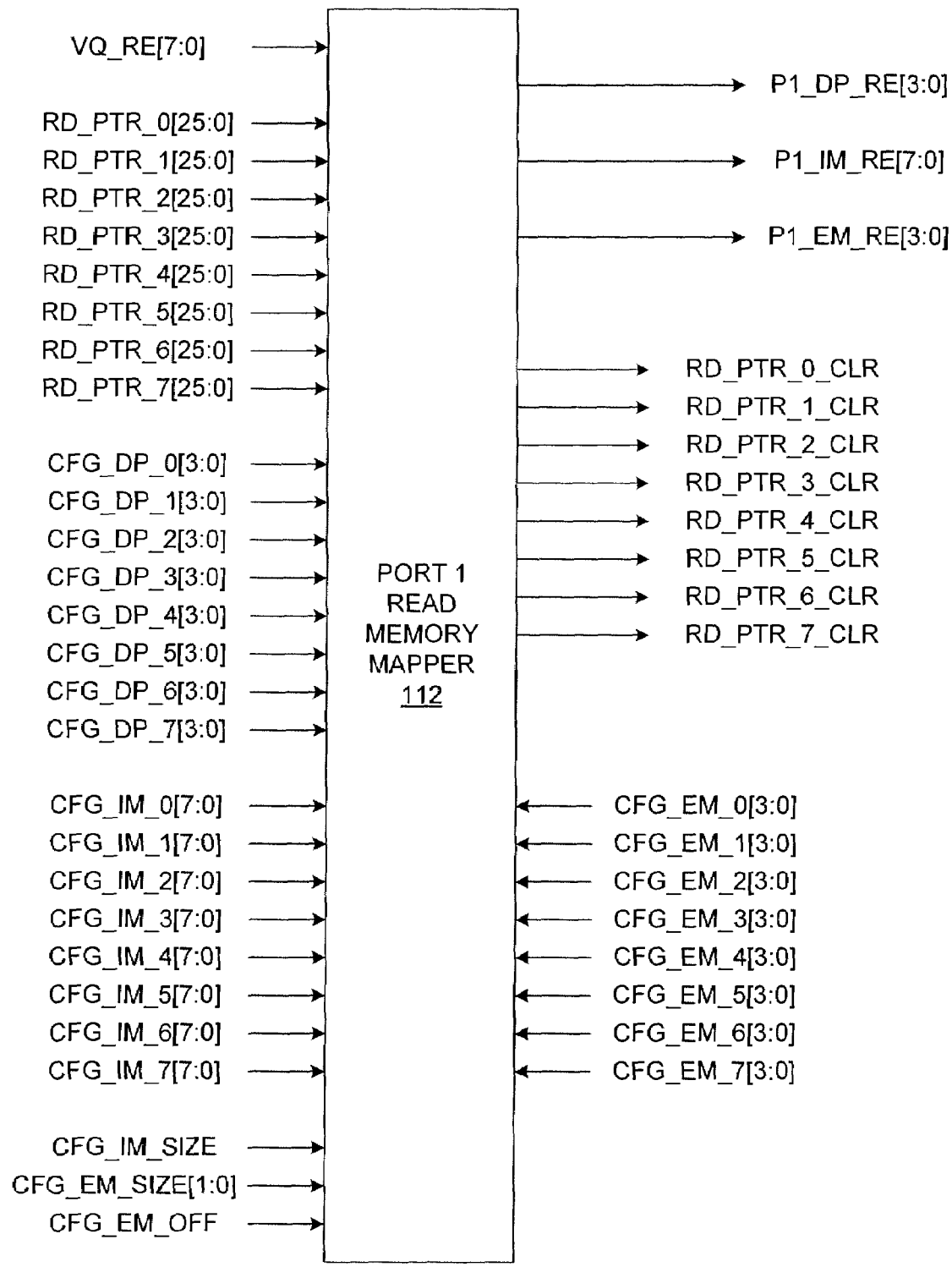
FIG. 7 is a block diagram of a read memory mapper in accordance with one embodiment of the present invention.

FIG. 7 is a block diagram of read memory mapper 112 in accordance with one embodiment of the present invention. In addition to receiving the contents of virtual queue configuration registers 113 and memory size register 114, read memory mapper 111 receives virtual queue read enable signals VQ_RE[0], VQ_RE[1], VQ_RE[2], VQ_RE[3], VQ_RE[4], VQ_RE[5], VQ_RE[6] and VQ_RE[7] from read control circuit 102. Read control circuit 102 activates the virtual queue read enable signals VQ_RE[0], VQ_RE[1], VQ_RE[2], VQ_RE[3], VQ_RE[4], VQ_RE[5], VQ_RE[6] and VQ_RE [7] to initiate read operations to virtual queues VQ0, VQ1, VQ2, VQ3, VQ4, VQ5, VQ6 and VQ7, respectively.

Read memory mapper 112 also receives virtual queue read pointer values RD_PTR_0[25:0], RD_PTR_1[25:0], RD_PTR_2[25:0], RD_PTR_3[25:0], RD_PTR_4[25:0], RD_PTR_5[25:0], RD_PTR_6[25:0] and RD_PTR_7[25:0] from read control circuit 101. The virtual queue read pointer values RD_PTR_0[25:0], RD_PTR_1[25:0], RD_PTR_2 [25:0], RD_PTR_3[25:0], RD_PTR_4[25:0], RD_PTR_5 [25:0], RD_PTR_6[25:0] and RD_PTR_7[25:0] specify the read addresses of the next read accesses to virtual queues VQ0, VQ1, VQ2, VQ3, VQ4, VQ5, VQ6 and VQ7, respectively.

In general, read memory mapper 112 identifies which one of the physical memory blocks 200 should be accessed in response to the received signals, and in response, activates a physical memory read enable signal to enable this physical memory block. More specifically, read memory mapper 112 provides physical memory read enable signals P1_DP_RE[3: 0] to enable read accesses to dual-port memory blocks DP3-DP0, respectively. Similarly, read memory mapper 112 provides physical memory read enable signals P1_IM_RE[7:0] to enable read accesses to internal memory blocks IM7-IM0, respectively. In addition, read memory mapper 112 provides physical memory read enable signals P1_EM_RE[3:0] to enable read accesses to external memory blocks EM3-EM0, respectively.

Read memory mapper 112 also provides read pointer clear signals RD_PTR_0_CLR, RD_PTR_1_CLR, RD_PTR_2_CLR, RD_PTR_3_CLR, RD_PTR_4_CLR, RD_PTR_5_CLR, RD_PTR_6_CLR, and RD_PTR_7_CLR, which are activated to clear the read pointer values RD_PTR_0[25:0], RD_PTR_1[25:0], RD_PTR_2[25:0], RD_PTR_3[25:0], RD_PTR_4[25:0], RD_PTR_5[25:0], RD_PTR_6[25:0] and RD_PTR_7[25:0], respectively.

Read memory mapper 112 operates in a manner similar to write memory mapper 111 in accordance with one embodiment of the present invention. Thus, the generation of the read pointer clear signals RD_PTR_n_CLR is represented by the following equation (where 'n' represents the integers from 0 to 7, inclusive). Note that read memory mapper 112 can independently calculate the VQn_size values, or simply use the VQn_size values calculated by write memory mapper 111.

$$RD\_PTR\_n\_CLR = (RD\_PTR\_n[25:0]) == (VQn\_size-1)) \quad (8)$$

Read memory mapper 112 generates the physical memory read enable signals and read pointer clear signals in the same manner that write memory mapper 111 generates the physical memory write enable signals and the write pointer clear signals.

The method of generating the physical memory read enable signals for dual port memory blocks allocated to virtual queue VQ0 can therefore be summarized as follows.

---
P1_DP_RE[3:0] generation:

```
m = 1
for (i=0; i<=3; i=i+1)
    if(CFG_DP_0[i] = 1)
        begin
            if(RD_PTR_0 != dp_block_size * m) P1_DP_RE[i] =
            VQ_RE[0];
            m=m+1
        end
```
---

Read memory mapper 112 generates the physical memory read enable signals for dual-port memory blocks allocated to the other virtual queues VQ1-VQ7 in the same manner described above for virtual queue VQ0.

The method of generating the physical memory read enable signals for internal and external memory blocks allocated to virtual queue VQ0 can be summarized as follows.

---
P1_IM_RE[7:0] and P1_EM_RE[3:0] generation:

```
m = 1;
for (i=0; i<=7; i=i+1)
    if(CFG_IM_0[i] = 1)
        begin
            if(RD_PTR_0 != im_block_size*(~cfg_im_size + 1)*m)
                P1_IM_RE[i] = VQ_RE[0];
            m=m+1
        end
m = 1;
    for (k=0; k<=3; k=k+1)
        if(CFG_EM_0[k] = 1)
            begin
                if(RD_PTR_0 != em_block_size*(cfg_em_size + 1)*m)
```
---
P1_IM_RE[7:0] and P1_EM_RE[3:0] generation:

```
                    P1_EM_RE[i] = VQ_RE[0];
                    m=m+1
                end
```
---

Read memory mapper 112 generates the physical memory read enable signals for internal and external memory blocks allocated to the other virtual queues VQ1-VQ7 in the same manner described above for virtual queue VQ0.

In the foregoing manner, serial buffer 100 advantageously provides the flexibility to allocate different types and sizes of physical memory to a plurality of virtual queues. Easy user allocation of the physical memory blocks to the virtual queues is facilitated by memory configuration registers 113 and memory size register 114. In one embodiment, the relatively large external memory blocks can advantageously be allocated to virtual queues used for data intensive operations, while the relatively small dual-port memory blocks (or internal memory blocks) can advantageously be allocated to virtual queues used for passing command and status information with minimum latency. The on-chip dual-port memory blocks and the on-chip internal memory blocks can be used without any external memory blocks to minimize product cost. Serial buffer 100 provides an efficient and flexible manner for utilizing available physical memory resources, which not only minimizes access latency of the serial buffer 100 but can also provide a large amount of buffer space to meet different application needs.

Although the present invention has been described in connection with various embodiments, it is understood that variations of these embodiments would be obvious to one of ordinary skill in the art. Thus, the present invention is limited only by the following claims.

We claim:
1. A serial buffer comprising:
a first set of memory blocks;
a second set of memory blocks having different access characteristics than the first set of memory blocks;
a plurality of configuration registers for allocating memory blocks to a plurality of virtual queues, wherein each of the configuration registers stores configuration bits for allocating memory blocks to a corresponding one of the virtual queues, and wherein each of the configuration registers is configured to store a first set of configuration bits for allocating memory blocks from the first set of memory blocks to the corresponding one of the virtual queues, and a second set of configuration bits for allocating memory blocks from the second set of memory blocks to the corresponding one of the virtual queues; and
a memory size register configured to store a memory size value used to determine a capacity of each of the memory blocks in the second set of memory blocks.
2. The serial buffer of claim 1, further comprising a memory bus configured to access a third set of memory blocks having different access characteristics than the first set of memory blocks.
3. The serial buffer of claim 2, wherein each of the plurality of configuration registers is further configured to store a third set of configuration bits for allocating memory blocks from the third set of memory blocks to the corresponding one of the virtual queues.
4. The serial buffer of claim 3, wherein each of the configuration registers is configured such that the corresponding one of the virtual queues may include either memory blocks from the first set of memory blocks or memory blocks from the second and/or third sets of memory blocks, but not both.

5. The serial buffer of claim 3, wherein the memory size register is further configured to store a control bit for enabling and disabling access to the third set of memory blocks on the memory bus.

6. The serial buffer of claim 2, wherein the first and second sets of memory blocks are located on an integrated circuit chip, and the third set of memory blocks are external to the integrated circuit chip.

7. The serial buffer of claim 6, wherein the third set of memory blocks are of the same memory type as the second set of memory blocks.

8. The serial buffer of claim 1, wherein the memory size value comprises a multiplier value.

9. The serial buffer of claim 1, further comprising a memory mapper configured to identify accesses to the virtual queues, and in response, enable accesses to the memory blocks allocated to the virtual queues.

10. The serial buffer of claim 9, wherein the memory mapper is configured to calculate the sizes of each of the virtual queues by summing the sizes of the memory blocks allocated to each of the virtual queues.

11. The serial buffer of claim 10, wherein the memory mapper is further configured to clear a first access pointer associated with a first one of the virtual queues when the first access pointer reaches the size of the first one of the virtual queues.

12. The serial buffer of claim 11, wherein the memory mapper is further configured to clear a second access pointer associated with the first one of the virtual queues when the second access pointer reaches the size of the first one of the virtual queues.

13. The serial buffer of claim 1, wherein each of the configuration registers is configured such that the first set of configuration bits allocates memory blocks from the first set of memory blocks to the corresponding one of the virtual queues, or the second set of configuration bits allocates memory blocks from the second set of memory blocks to the corresponding one of the virtual queues, but not both.

14. The serial buffer of claim 1, wherein the first set of memory blocks comprises a plurality of dual-port memory blocks.

15. The serial buffer of claim 14, wherein the second set of memory blocks comprises a plurality of random access memory blocks.

16. The serial buffer of claim 1, wherein memory blocks in the first set of memory blocks have a first capacity and memory blocks in the second set of memory blocks have a second capacity, wherein the first capacity is less than the second capacity.

* * * * *